United States Patent
Yang et al.

[11] Patent Number: 6,107,660
[45] Date of Patent: Aug. 22, 2000

[54] VERTICAL THIN FILM TRANSISTOR

[75] Inventors: Ching-Nan Yang, Hsinchu Hsien; Chia-Chen Liu, Hsinchu, both of Taiwan

[73] Assignee: Worldwide Semiconductor Manufacturing Corp., Hsinchu, Taiwan

[21] Appl. No.: 09/314,623

[22] Filed: May 19, 1999

[51] Int. Cl.⁷ .................................................. H01L 29/786
[52] U.S. Cl. ........................... 257/329; 257/330; 257/393
[58] Field of Search ..................... 257/329, 330, 257/393

[56] References Cited

U.S. PATENT DOCUMENTS

| | | | |
|---|---|---|---|
| 4,902,641 | 2/1990 | Koury, Jr. ................................. | 257/329 |
| 5,545,586 | 8/1996 | Koh ........................................... | 437/89 |
| 5,554,870 | 9/1996 | Fitch et al. ................................ | 257/329 |
| 5,668,391 | 9/1997 | Kim et al. ................................. | 257/329 |
| 5,780,888 | 7/1998 | Maeda et al. ............................. | 257/329 |
| 5,994,735 | 11/1999 | Maeda et al. ............................. | 257/329 |

*Primary Examiner*—David Hardy

[57] ABSTRACT

The method includes forming a first polysilicon on a substrate. Subsequently, a first dielectric layer is formed on the first polysilicon. A second polysilicon is pattern on the first dielectric layer, followed by depositing a second dielectric layer formed thereon. An etching is performed to etch the second dielectric layer, the second polysilicon layer through the first dielectric layer for generating an opening. An oxide layer is formed on the side-wall of the opening. A doped polysilicon layer is located at the lower portion of the opening. An undoped polysilicon layer is deposited on the second dielectric layer and refilled into the opening. An etching back is carried out to remove the layer over the second dielectric layer. A third polysilicon is patterned on the surface of the second dielectric layer. An isolation layer is deposited over the feature. A plurality of contact holes are generated in those isolation layers.

9 Claims, 5 Drawing Sheets

VERTICAL THIN FILM TRANSISTOR

FIELD OF INVENTION

The present invention relates to semiconductor devices, and more specifically, to a method of manufacturing of a vertical thin film transistor and the structure of the same.

BACKGROUND

In transistor, a channel region in the semiconductor under the gate is doped with ions that are opposite to that of the source and drain. The operation of the transistor includes the application of applying a voltage to the gate. By varying the transverse electrical field, it is possible to control the current flow by modulating the longitudinal conductance of the channel. If the drain bias is applied such that source-body and drain-body junctions remain reverse-bias. A positive bias is applied to the gate of the NMOS, electrons will be attracted to the channel region, once enough electrons are drawn into the channel region by the positive gate voltage, the channel connects the source and the drain.

Thin film transistor (TFT) is a kind of a field effect transistor (FET). In typical FET, the source and drain and the channel region are formed in the substrate composed of single crystal silicon. The channel region of the TFT is different from the conventional FET. To phrase in another way, the channel region of the TFT is formed in a polysilicon or amorphous silicon layer on a substrate. For the application, the TFT can be used in flat panel display as switching transistors and in static random access memory as load devices. In order to form a quality SRAM, the TFT have to be decreased on off-current and increased the on-current. It is because that one of the important parameters to determine the performance is the drain off-set structure that is parts outside the gate electrode. The function of the off-set structure is similar to the lightly doped drain (LDD) structure in FET. The drain off-set structure can reduce the short channel effect or reduce punch-through effect caused by hot carrier and the structure also reduces the off-state leakage.

One of the approaches can be seen in U.S. Pat. No. 5,001,540 to Ishihara, he develops a dual gate TFT with off-set structure. The off-set region is the extension of a layer used to form the channel region. The dopant concentration is the same with that of channel region. Further, in the structure, the dimension of the off-set is determined by the width of the side walls spacers. FIG. 1 shows a further cross sectional view of a conventional polysilicon PMOS cell. In the cell, isolation structures composed of oxide 4 are formed in the substrate 2 for isolation. A driver NMOS is formed on the top of the substrate 2. A transistor 8 is located adjacent to the NMOS. A gate 10 isolated by dielectric material 6 is formed on the driver NMOS, and a polysilicon layer 10 is used to connect the driver NMOS and the doped region of the transistor 8. The gate 10 and the polysilicon layer 10 are composed of N type polysilicon. A P conductive type polysilicon layer 12 goes over the dielectric layer 6. A part of the layer 12 is implanted to define the source and drain. An off-set can be found adjacent to the drain. The separation between the source and drain defines the channel. The channel is oriented in a direction substantially parallel to the substrate, this leads to the conventional structure occupies a large cell area. It is not suitable to the trend of manufacture with high packing density. The channel formed of polysilicon provides smaller on-current compared to monocrystalline silicon channel.

Shepard provides a vertical dual gate thin film transistor, the article can be seen in U.S. Pat. No. 5,574,294. Shepard disclosed a self-aligned process for forming the source and drain regions in a dual gate TFT and further allows for the formation of off-set. Recently, some researches and developments have been approached to develop a vertical thin film transistor. The channel of the device is vertical to the surface of the substrate. Some arts provide a device cell with source, channel and drain that are vertically formed in a trench. The devices provide an advantage of higher density than others.

What is required is a TFT with a vertical cell structure to reduce the occupied area, thereby increasing the packing density.

SUMMARY

An object of the present invention is to provide a thin film transistor (TFT) with a vertical cell structure.

An further object of the present invention is to provide a method of forming a thin film transistor (TFT) with an offset by easier controlled process.

In accordance with the present invention, a vertical thin film transistor is provided. The method includes forming a first doped polysilicon on a substrate. Subsequently, a first dielectric layer is formed on the patterned polysilicon and the substrate to act as an isolation layer. A second polysilicon is pattern on the first dielectric layer, followed by depositing a second dielectric layer formed thereon. The second polysilicon serves as the gate of the TFT. An etching is performed to etch the second dielectric layer, the second polysilicon layer through the first dielectric layer to expose the surface of the first polysilicon layer, thereby generating an opening.

An oxide layer is formed on the side-wall of the opening and the upper surface of the second dielectric layer to act the gate oxide of the TFT. Preferably, the oxide can be formed by a high temperature oxide (HTO) procedure. A doped polysilicon layer is located at the lower portion of the opening to act as a first doped region of the TFT. An undoped polysilicon layer is deposited on the second dielectric layer and refilled into the opening. An etching back is carried out to remove the layer over the second dielectric layer. A third polysilicon is patterned on the surface of the second dielectric layer and contacts with the body of the TFT as a second doped region. An isolation layer is deposited over the feature after the formation of the TFT. A plurality of contact holes are generated in the isolation layer by using well known lithography and etching techniques to expose the first, second and third polysilicon layers, respectively.

The vertical thin film transistor includes a conductive pad formed on the substrate. A first isolation layer is formed on the conductive pad and the substrate. A gate pattern is patterned on the first isolation layer. A second isolation layer is formed on the first isolation layer and the gate pattern. An opening is formed through the composition layer consisted of the second isolation layer, the first isolation layer and the gate pattern. A gate oxide is formed on a surface of the side-wall of the opening. A first doped region is located at the lower portion of the opening. The undoped polysilicon is refilled in the opening and on the first doped region. A conductive structure is formed on the opening and contacts the undoped polysilicon to act as a second doped region. A third isolation layer having a plurality of holes covers on the conductive structure and the second isolation layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

The present invention proposes a novel method and a novel structure to fabricate a high density thin film transistor (TFT) with vertical source, channel and drain regions. A dimension of the off-set structure can be easily controlled by the process. The TFT can be used in flat panel display as switching transistors and in static random access memory as load devices. Under this structure, the device can reduce the punch-through effect and the off-state leakage. Hereinafter, the preferred embodiment of the present invention will be described with reference to accompanying drawing. The detailed description can be seen as follows.

Figure 1:
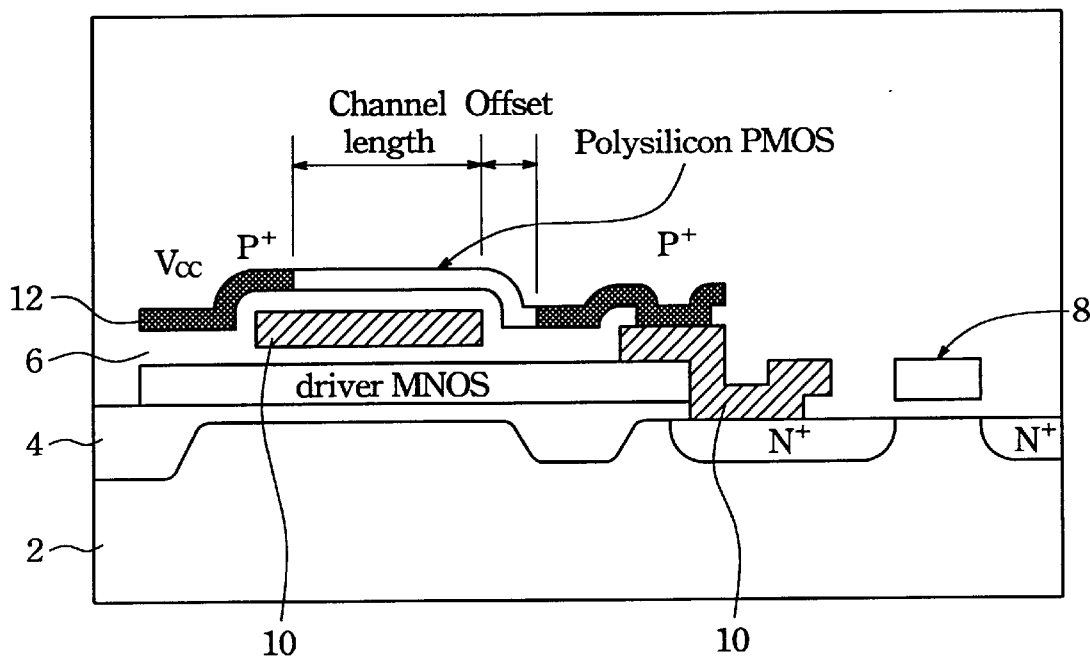
FIG. 1 is a cross sectional view of a semiconductor substrate illustrating a structure of a TFT according to the prior art.
Figure 2:
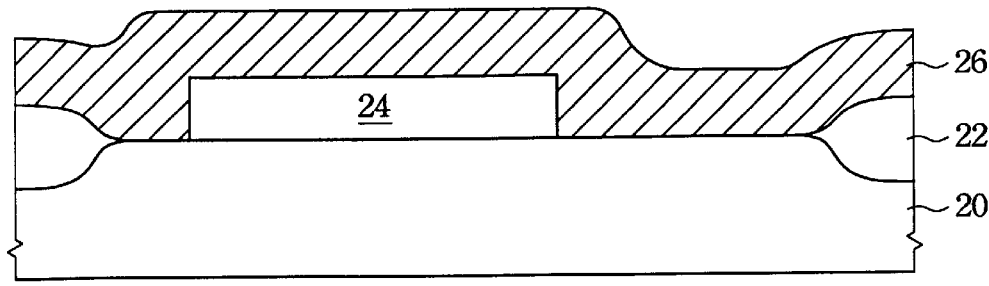
FIG. 2 is a cross sectional view of a semiconductor substrate illustrating the steps of forming a first polysilicon layer and a first dielectric layer on a semiconductor substrate according to the present invention.

Referring to FIG. 2, any suitable semiconductor material is provided as a substrate. Foe example, a single crystal substrate 20 with a <100> crystallographic orientation is used for the preferred embodiment. Other type substrate may be used. In this embodiment, the substrate 20 is provided, a plurality of isolation structures such as field oxide (FOX) regions 22 are created for the purposes of defining the active area (AA). Typically, the FOX regions 22 are created via a photoresist and dry etching to define a silicon nitride-silicon dioxide composite layer. After the photoresist is removed and wet clean process, thermal oxidation in an oxygen ambient is performed to form the FOX regions 22, to a thickness of about 3000–8000 angstroms. The silicon nitride layer is then typically removed using hot phosphoric acid solution while the silicon dioxide is removed by using diluted HF or BOE solution. Alternatively, an isolation structure formed by shallow trench isolation technique can be used.

Successively, a doped polysilicon layers 24 is deposited by chemical vapor deposition (CVD) on the substrate 20. Then, the doped polysilicon layer 24 is patterned on the substrate to have a desired pattern. The doped polysilicon layer 24 can be formed by performing an ion implantation after the layer is deposited or by in-situ deposition technique. wherein the doped polysilicon layer 24 is formed to have a concentration of dopants of about 1E20 to 3E20 atoms/cm$^3$.

Subsequently, a dielectric layer 26 is formed on the patterned polysilicon 24 and the substrate 20 to act as an isolation layer. In an embodiment, the dielectric layer 26 is composed of silicon oxide or the like. The oxide can be formed by a low temperature CVD, such as plasma enhanced CVD, on the feature using silane as a precursor. Alternatively, the oxide may be formed using other known oxide chemical compositions and procedures. For example, the gate oxide layer 28 can be silicon dioxide formed using a chemical vapor deposition process, with a tetraethylorthosilicate (TEOS) source, at a temperature between about 600 to 800 degrees centigrade and a pressure of about 0.1 to 10 torr. In a case, the thickness of the oxide layer 26 is about 3000–5000 angstroms.

Figure 3:
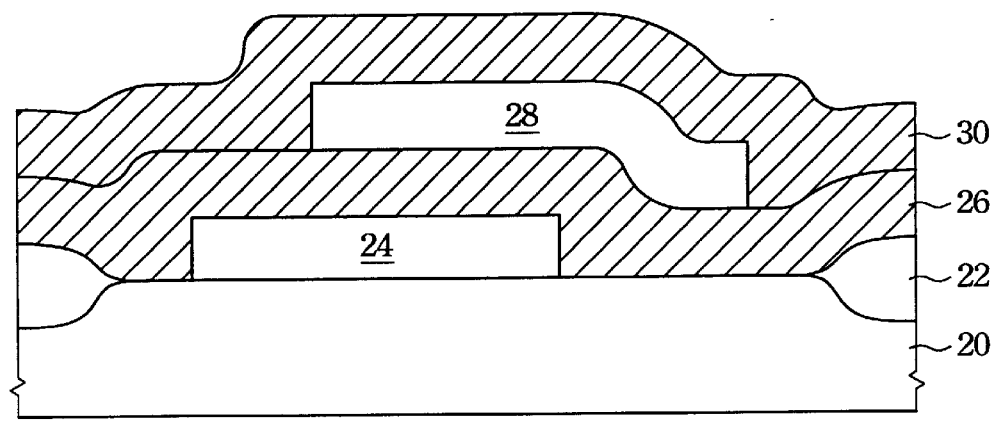
FIG. 3 is a cross sectional view of a semiconductor substrate illustrating the steps of forming a second polysilicon layer and a second dielectric layer according to the present invention.

Referring to FIG. 3, a second doped polysilicon layer 28 is pattern on the dielectric layer 26, followed by depositing a second dielectric layer 30 formed thereon. Similarly, the second polysilicon layer 28 and the dielectric layer 30 can be formed by using aforementioned method, material or other well-known technology. Thus, the description is omitted. The concentration of dopants of the second doped polysilicon layer 28 is about 1E20 to 3E20 atoms/cm$^3$.

Figure 4:
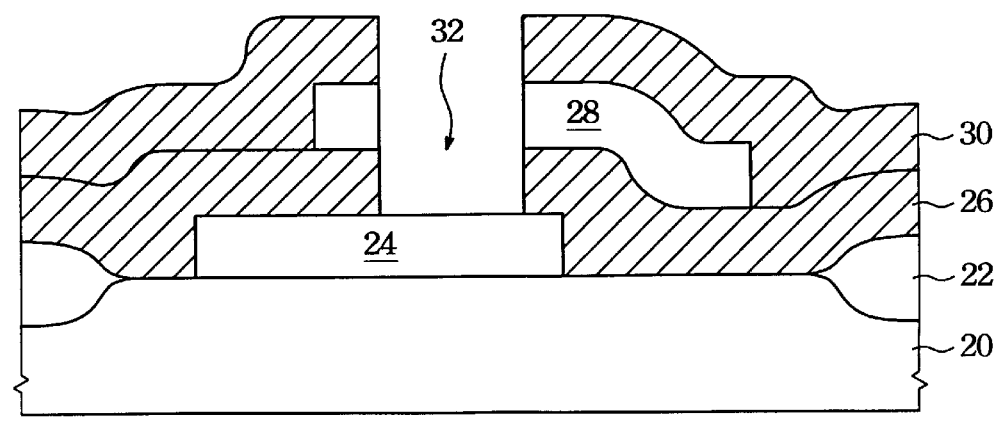
FIG. 4 is a cross sectional view of a semiconductor substrate illustrating the step of forming an opening in the first, second dielectric layer and the second polysilicon layer on the semiconductor substrate according to the present invention.

The second polysilicon 28 serves as the body of the TFT. As shown in FIG. 4, an etching is performed to etch the second dielectric layer 30, the second polysilicon layer 28 through the first dielectric layer 26 for exposing the surface of the polysilicon layer 28 by introducing a lithography technique. Therefore, an opening 32 is created in those layers. It has to be noted that the polysilicon used to act the body of the TFT is separated adjacent to the opening 32 in the cross sectional view.

Figure 5:
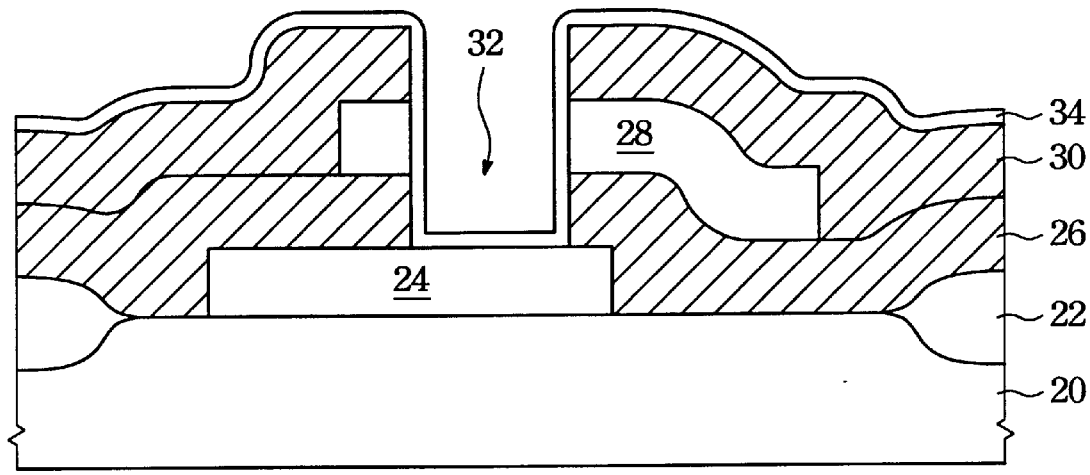
FIG. 5 is a cross sectional view of a semiconductor substrate illustrating the step of forming gate oxide in the opening according to the present invention.
Figure 6:
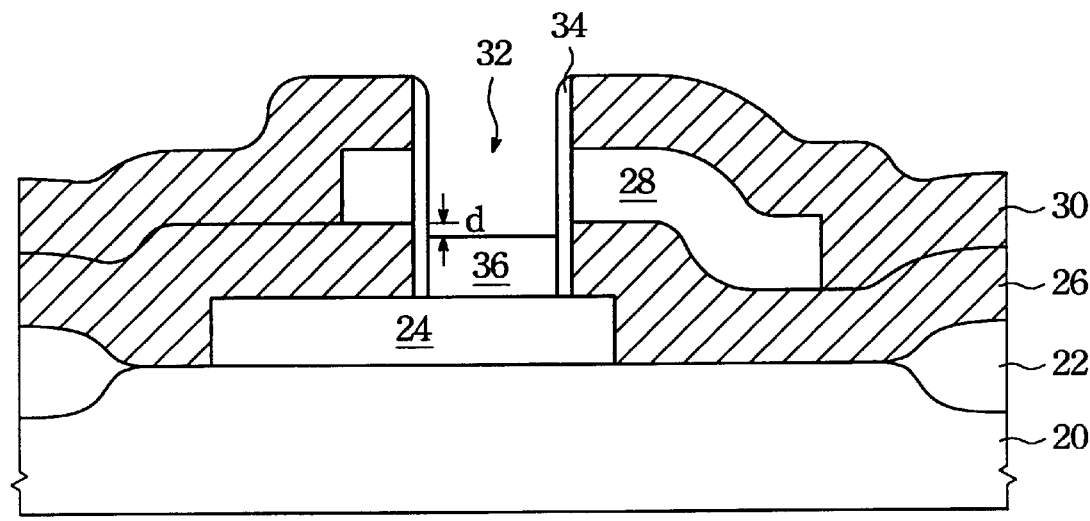
FIG. 6 is a cross sectional view of a semiconductor substrate illustrating the step of forming first doped region in the opening according to the present invention.

FIG. 5 depicts the formation of an oxide layer 34 on the side-wall of the opening 32 and the upper surface of the second dielectric layer 30. The oxide acts the gate oxide of the TFT. Thus, the gate oxide 34 surrounds the surface of the side-wall of the opening 32. Preferably, the oxide can be formed by a so-called high temperature oxide (HTO) procedure. The temperature for forming the HTO oxide is about 650 to 750 centigrade degrees. The thickness of the oxide ranges from about 200 to 400 angstroms. Turning to FIG. 6, the HTO oxide 34 is anisotropically etched, thereby leaving the oxide layer 34 on the side-wall of the opening 32 only. The oxide layer 32 on the bottom of the opening 34 and the upper surface of the layer 30 is removed. A doped polysilicon layer 36 is refilled into the opening 32 and then performing an etching process to etch the polysilicon layer 36. A residual portion of the layer 36 is located at the lower portion of the opening 32. The residual portion 36 contacts with the first polysilicon layer 24 and acts as a doped region (source or drain) of the TFT. Preferably, the doped polysilicon 36 includes dopants with P conductive type ions. If the area 36 acts as a drain, an off-set structure indicated by "d" can be controlled easily by etching time mode such that the surface of the doped polysilicon 36 lower than that of the second polysilicon 28 as the gate.

Figure 7:
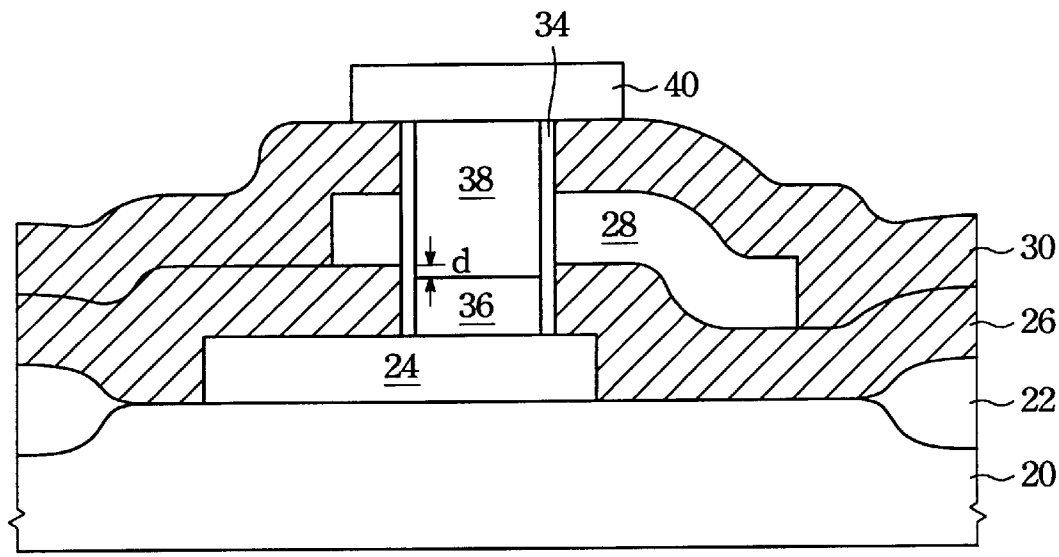
FIG. 7 is a cross sectional view of a semiconductor substrate illustrating the steps of forming undoped polysilicon on the first doped region and forming a third polysilicon layer thereon according to the present invention.

Now referring to FIG. 7, an undoped polysilicon layer 38 is deposited on the second dielectric layer 30 and refilled into the opening 32. An etching back is carried out to remove the layer 38 excesses over the second dielectric layer 30, thereby defining the body of the TFT in the opening 32. In the preferably embodiment, the undoped polysilicon layer 38 can be attacked by using fluorine based chemistry. The surface of the undoped polysilicon 38 adjacent to the gate oxide 34 is used as the channel region. The area for the channel region is larger compared to the prior art cell. The on-state current will be upgraded by the structure.

A third polysilicon 40 is patterned on the surface of the second dielectric layer 30 and contacts with the body of the TFT, that is the undoped polysilicon 38. The patterned third polysilicon 40 is utilized as a further doped region (drain or source) of the TFT. The concentration of dopants of the third doped polysilicon layer 40 is about 1E20 to 3E20 atoms/$cm^3$.

Figure 8:
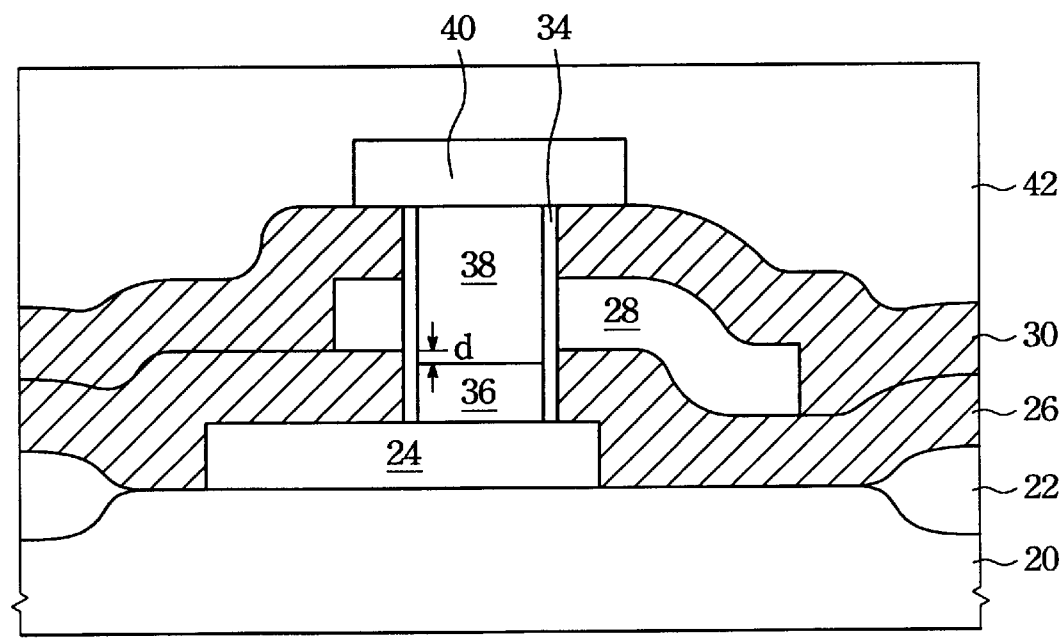
FIG. 8 is a cross sectional view of a semiconductor substrate illustrating the step of forming a third dielectric layer according to the present invention.
Figure 9:
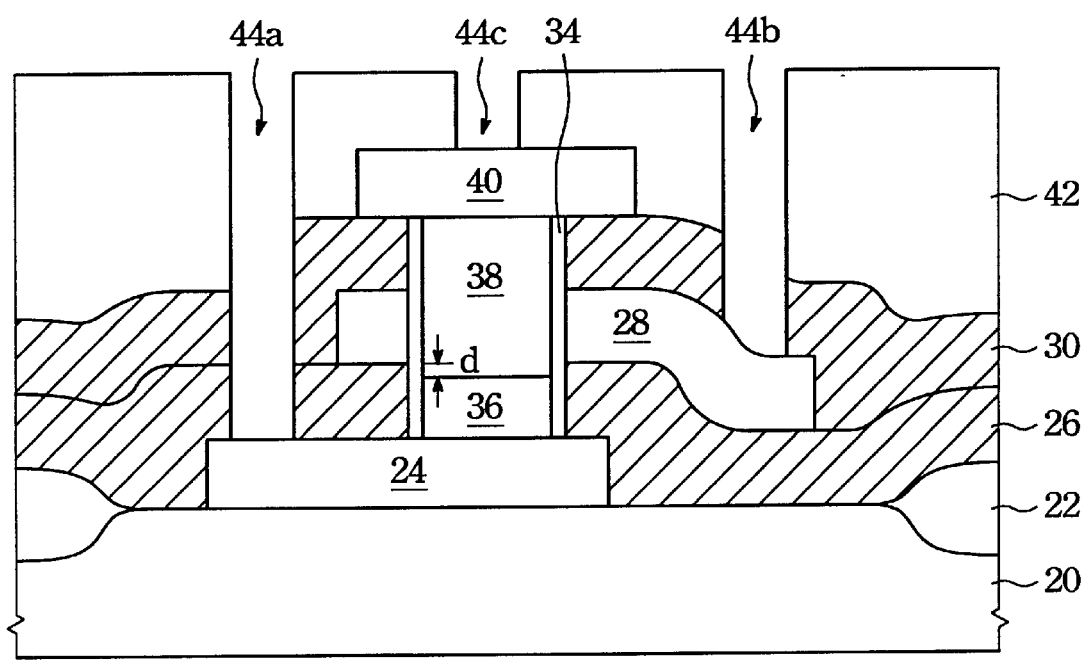
FIG. 9 is a cross sectional view of a semiconductor substrate illustrating the step of forming a plurality of holes in the first, second and third dielectric layers according to the present invention.

Turning to FIG. 8, an isolation layer 42 consisted of dielectric layer is deposited over the feature after the formation of the TFT. A plurality of contact holes 44 are generated in the isolation layer 42 by using well known lithography and etching techniques to expose the first, second and third polysilicon layers 24, 28 and 40, respectively, as shown in FIG. 9. The contact holes 44 provide electrical connection paths to reach those regions.

The vertical thin film transistor in accordance with the present invention is depicted in FIG. 9. The cell includes a conductive pad 24 formed on the substrate 20. A first isolation layer 26 is formed on the conductive pad 24 and the substrate 20. A gate pattern 28 is patterned on the first isolation layer 28. Wherein the gate patterned 28 is partially overlap with the conductive pad 24. A second isolation layer 30 is formed on the first isolation layer 26 and the gate pattern 28. An opening 32 is formed through the composition layer consisted of the second isolation layer 30, the first isolation layer 24 and the gate pattern 28. A gate oxide 34 is formed on a surface of the side-wall of the opening 32. A first doped region (drain or source) 36 is located at the lower portion of the opening 32. Preferably, the upper surface of the first doped region is lower than the lower surface of the gate pattern 28. The undoped polysilicon 38 is refilled in the opening 32 and on the first doped region 36. A conductive structure 40 is formed on the opening 32 and contacts the undoped polysilicon 38 to act as a second doped region (source or drain). A third isolation layer 42 covers on the conductive structure 40 and the second isolation layer 30. A first contact hole 44a pass through the first, second and third isolation layers 26, 30 and 42 to expose the conductive pad 24. A second contact hole 44b is generated in the second and third isolation layers 30 and 42 to expose the gate 28. The second doped region 40 is exposed by a third opening 44c through the third isolation layer 42.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A vertical thin film transistor formed on a substrate, the vertical thin film transistor comprising:
   a conductive pad formed on said substrate;
   a first isolation layer formed on said conductive pad and said substrate;
   a gate patterned on said first isolation layer, wherein said gate is partially overlap with said conductive pad;
   a second isolation layer formed on said first isolation layer and said gate, wherein said second isolation layer, said first isolation layer and said gate includes an opening through therein;
   a gate oxide formed on a side-wall of said opening;
   a first doped region located at a lower portion of said opening;
   an undoped polysilicon formed in said opening and on said first doped region;
   a conductive structure formed on said opening and contacting said undoped polysilicon to act as a second doped region; and
   a third isolation layer formed on said conductive structure and said second isolation layer; wherein
   said first, second and third isolation layers includes a first contact hole through therein, said
   second and said third isolation layers including a second contact hole through therein, said
   third isolation layer including a third opening through therein.

2. The vertical thin film transistor of claim 1, wherein said first isolation layer comprises oxide.

3. The vertical thin film transistor of claim 1, wherein said second isolation layer comprises oxide.

4. The vertical thin film transistor of claim 1, wherein said third isolation layer comprises oxide.

5. The vertical thin film transistor of claim 1, wherein a concentration of dopants of said conductive pad is about 1E20 to 3E20 atoms/$cm^3$.

6. The vertical thin film transistor of claim 1, wherein a concentration of dopants of said gate is about 1E20 to 3E20 atoms/$cm^3$.

7. The vertical thin film transistor of claim 1, wherein a concentration of dopants of said conductive structure is about 1E20 to 3E20 atoms/$cm^3$.

8. The vertical thin film transistor of claim 1, wherein said first doped region comprises polysilicon.

9. The vertical thin film transistor of claim 1, wherein said second doped region comprises polysilicon.

* * * * *